(12) United States Patent
Su et al.

(10) Patent No.: US 9,173,284 B2
(45) Date of Patent: Oct. 27, 2015

(54) FLEXIBLE CIRCUIT BOARD WITH PLANARIZED COVER LAYER STRUCTURE

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 127 days.

(21) Appl. No.: 14/068,029

(22) Filed: Oct. 31, 2013

(65) Prior Publication Data

US 2015/0027751 A1      Jan. 29, 2015

(30) Foreign Application Priority Data

Jul. 26, 2013   (TW) ............................. 102126779 A

(51) Int. Cl.
*H05K 1/00*     (2006.01)
*H05K 1/02*     (2006.01)
*H01B 7/08*     (2006.01)
*H05K 3/28*     (2006.01)

(52) U.S. Cl.
CPC .............. *H05K 1/024* (2013.01); *H01B 7/0838* (2013.01); *H01B 7/0861* (2013.01); *H05K 1/025* (2013.01); *H05K 1/0242* (2013.01); *H05K 3/28* (2013.01); *H05K 3/281* (2013.01); *H05K 2201/0323* (2013.01); *H05K 2201/098* (2013.01); *H05K 2201/09236* (2013.01); *H05K 2201/09881* (2013.01)

(58) Field of Classification Search
CPC .... H01B 7/0838; H01B 13/00; H01L 21/336; H01L 23/48; H01L 23/52; H01L 29/786; H01L 29/24; H01L 33/64; H05K 1/14; H05K 1/00; H05K 1/02; H05K 1/03; H05K 1/16; H05K 1/024; H05K 1/0283; H05K 1/0298; G06F 3/045; G06F 7/00; G11B 5/48; H01P 3/08
USPC ............ 174/251, 254, 255, 250, 260; 257/57, 257/754; 333/238; 345/174; 360/244; 430/311, 313; 438/151, 28; 361/784
See application file for complete search history.

(56) References Cited

U.S. PATENT DOCUMENTS

| | | | |
|---|---|---|---|
| 2005/0087877 A1* | 4/2005 | Han et al. ...................... | 257/758 |
| 2010/0326706 A1* | 12/2010 | Muro et al. .......... | H05K 1/0218 174/254 |
| 2011/0094784 A1* | 4/2011 | Muro et al. .................... | 174/260 |
| 2012/0238045 A1* | 9/2012 | Roberts .......................... | 438/28 |
| 2013/0056248 A1* | 3/2013 | Kajiya et al. .......... | H05K 1/028 174/254 |
| 2014/0326484 A1* | 11/2014 | Tajima ................. | H05K 1/0216 174/250 |

* cited by examiner

*Primary Examiner* — Timothy Thompson
*Assistant Examiner* — Guillermo Egoavil
(74) *Attorney, Agent, or Firm* — Rosenberg, Klein & Lee

(57) ABSTRACT

A planarized cover layer structure of a flexible circuit board includes an insulation layer bonded through a first adhesive layer to a surface of each one of conductive signal lines laid on a substrate of a flexible circuit board. Separation areas respectively formed between adjacent ones of the conductive signal lines are each formed with a filling layer, so that the filling layer provides the first adhesive layer with a planarization height in the separation areas and the planarization height is substantially equal to the height of the conductive signal lines. The filling layer can alternatively be of a height that is higher than the surface of the conductor layer by a covering height so that the first adhesive layer has a planarization height in the separation areas and the planarization height is substantially equal to the sum of the height of the conductive signal lines and the covering height.

17 Claims, 5 Drawing Sheets

(12)

FLEXIBLE CIRCUIT BOARD WITH PLANARIZED COVER LAYER STRUCTURE

BACKGROUND OF THE INVENTION

1. Field of the Invention

The present invention relates to a design of a structure of a flexible circuit board, and in particular to a planarized cover layer structure of a flexible circuit board.

2. The Related Arts

In various electronic products that are currently prevailing, including notebook computers, personal digital assistants, and mobile phones, flexible flat cable and flexible circuit boards are commonly used as a carrier board for transmission of signals.

Referring to FIGS. 1 and 2, which are respectively a schematic plan view and a cross-sectional view showing a conventional flexible circuit board, as shown in the drawings, a substrate 1 has a first surface 1 and a second surface 2.

A conductor layer 2 is bonded to the first surface 11 of the substrate 1. The conductor layer 2 comprises a plurality of extended conductive signal lines 21. The conductive signal lines 21 are spaced from each other by a predetermined distance, whereby every two adjacent ones of the conductive signal lines 21 define therebetween a separation area 22. The conductive signal lines 21 have a predetermined line height h1 and are generally made of a copper foil material or a composite material.

The substrate 1 is arranged to extend in an extension direction and a free end of the substrate 1 is provided with a plurality of conductive contacts 13. The free end of the substrate 1 is insertable into an insertion slot (not shown) to have the conductive contacts 13 of the substrate 1 electrically engaging corresponding contacts provided in the insertion slot. A first adhesive layer 31 is formed on a surface of the conductor layer 2, which is bonded by the first adhesive layer 31 to an insulation cover layer 4.

In a known manufacturing process, the insulation cover layer 4 is subjected to pressing so that with the adherence of the first adhesive layer 31, the insulation cover layer 4 is securely bonded to the first surface 11 of the conductor layer 2. Due to the separation areas 22 existing between the conductive signal lines 21 of the conductor layer 2, during the process when the insulation cover layer 4 is pressed to bond, the first adhesive layer 31 is deformed and recessed due to being subject to the pressure thereby showing a wave like corrugated surface structure. Thus, the surface where the insulation layer 4 is set is irregular and non-flat surface. This might lead to poor quality of the flexible circuit board and inconsistency of electrical impedance among signal transmission paths provided on the flexible circuit board may result, making it difficult to precisely control the electrical impedance thereof.

Referring to FIG. 3, a cross-sectional view is given to illustrate another conventional flexible circuit board, of which the structure is similar to the conventional flexible circuit board shown in FIG. 2. A difference is that each of the conductive signal lines 21 of the conductor layer 2 is bonded by a second adhesive layer 32 to the first surface 11 of the substrate 1.

In practical applications, both known flexible circuit boards exhibit the above discussed shortcoming and thus lead to problems, such as poor impedance match, reflection of signal, spreading of electromagnetic wave, errors in transmitting and receiving signals, and distortion of signal waveform.

The existence of these problems causes troubles to the circuit boards that are used in commonly used high-precision electronic facility.

For electronic devices (such as notebook computers) that have relatively high working frequencies, the precision of impedance gets more severe for higher working frequencies. The circuit boards that are manufactured with the conventional technology may not suit the need of the industry.

SUMMARY OF THE INVENTION

Thus, an object of the present invention is to provide a planarized cover layer structure of a flexible circuit board, which eliminates the problems of deformation and recess of an insulation cover layer and an adhesive layer during the process of bonding the insulation cover of the flexible circuit board.

Another object of the present invention is to provide a structure of a flexible circuit board that comprises a planarized cover layer so that the flexible circuit board may have a flat and regular surface.

To achieve the above objects, the present invention is structured such that an insulation layer is bonded through a first adhesive layer to a surface of each one of conductive signal lines laid on a substrate of a flexible circuit board. Separation areas that are respectively formed between adjacent ones of the conductive signal lines are each formed with a filling layer, so that the filling layer provides the first adhesive layer with a planarization height in the separation areas and the planarization height is substantially equal to the height of the conductive signal lines.

In another embodiment of the present invention, the filling layer can alternatively be of a height that is higher than the surface of the conductor layer by a covering height so that the first adhesive layer has a planarization height in the separation areas and the planarization height is substantially equal to the sum of the height of the conductive signal lines and the covering height.

The conductive signal lines are provided for transmitting a signal that is a differential-mode signal and may have a cross-section that is of a shape of one of a rectangle, a trapezoid, a circle, and an ellipse.

The filling layer is formed by filling a liquid state of one of a low dielectric constant material, a low dissipation loss material, a Teflon material in the separation areas, followed by curing through heating or irradiation of ultraviolet light or Infrared light to get fixed and shaped and thus forming the filling layer.

The insulation cover layer has a surface that is provided with a first metal layer. The second surface of the substrate is bonded to a second metal layer.

The substrate may comprise one of a single-sided board, a double-sided board, and a multilayer board.

The efficacy is that the present invention provides a flexible circuit board that does not suffer deformation and recessing of an insulation cover layer and an adhesive layer during the process that the insulation cover layer is pressed to bond. Further, the insulation cover layer of the flexible circuit board is provided with a regular and flat surface. In practical industrial applications, it is possible to effectively improve the problems of poor impedance match, reflection of signal, spreading of electromagnetic wave, errors in transmitting and receiving signals, and distortion of signal waveform. The technique provided by the present invention is of particular benefit for electronic devices having relatively high working frequencies.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
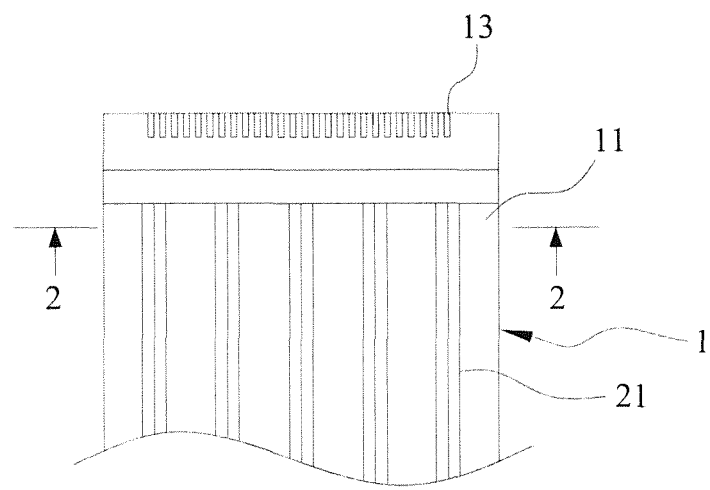
FIG. 1 is a schematic plan view showing a conventional flexible circuit board.
Figure 2:
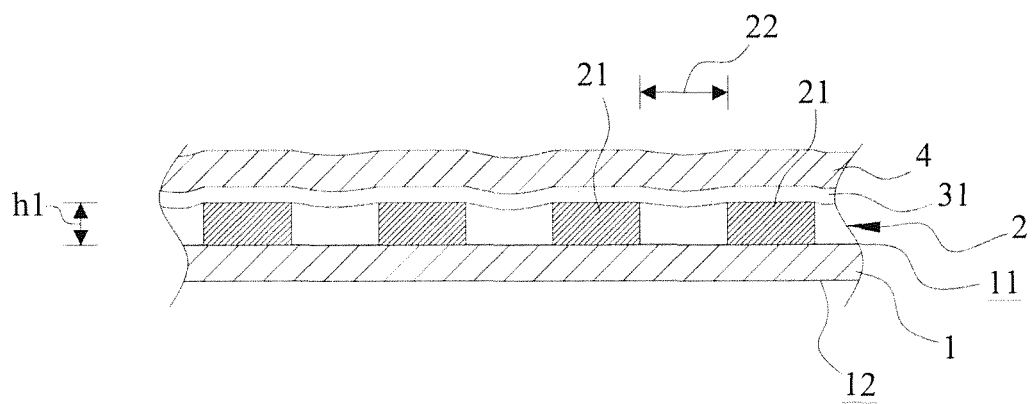
FIG. 2 is a cross-sectional view taken along line 2-2 of FIG. 1.
Figure 3:
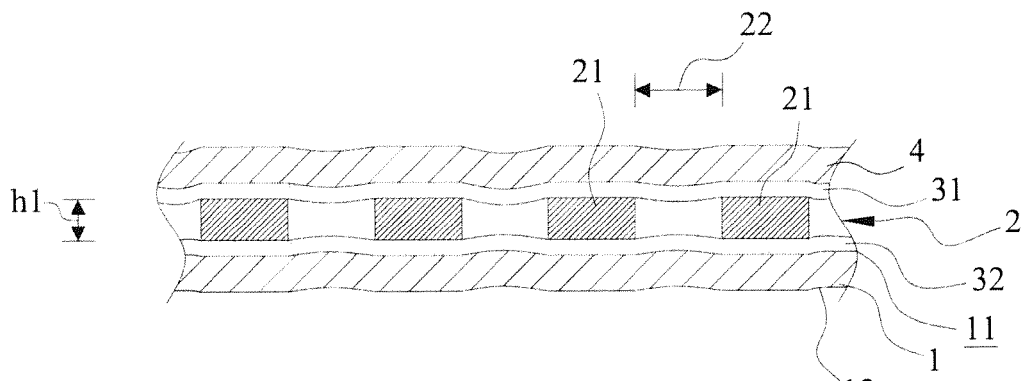
FIG. 3 is a cross-sectional view showing another conventional flexible circuit board.
Figure 4:
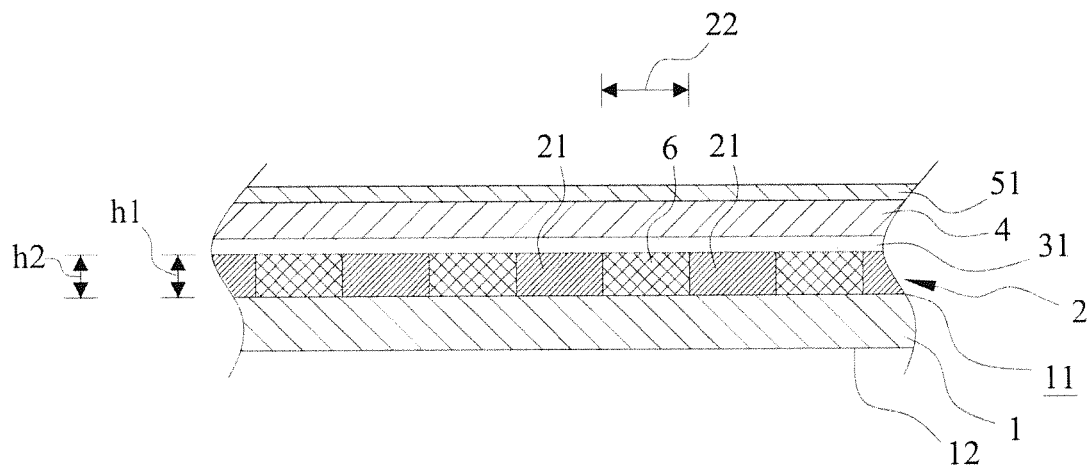
FIG. 4 is a cross-sectional view showing a first embodiment of the present invention.

With reference to the drawings and in particular to FIG. 4, a cross-sectional view of a first embodiment of the present invention is shown. As illustrated in the drawing, a substrate 1 comprises a first surface 11 and a second surface 12.

A conductor layer 2 is bonded to the first surface 11 of the substrate 1. A first adhesive layer 31 is formed on a surface of the conductor layer 2. The conductor layer 2 comprises a plurality of extended conductive signal lines 21. The conductive signal lines 21 have a predetermined line height h1 and are generally made of a copper foil or a composite material.

An insulation cover layer 4 is laminated through the first adhesive layer 31 on the surface of the conductor layer 2. The insulation cover layer 4 is generally made of an insulation material or is alternatively made of one of pure resin, coverlay, and ink. The insulation cover layer 4 has a surface that further comprises a first metal layer 51. The first metal layer 51 is made of a material that is one of a sliver-based material layer, an aluminum-based material layer, a copper-based material layer, a conductive carbon paste, a conductive particle included resin layer.

The conductive signal lines 21 are spaced from each other by a predetermined distance so as to define a separation area 22 between adjacent ones of the conductive signal lines 21. The conductive signal lines 21 have a cross-section that is of a shape of one of a rectangle, a trapezoid, a circle, and an ellipse and are provided for transmitting for example a high-frequency differential-mode signal.

The separation areas 22 between the conductive signal lines 21 of the conductor layer 2 are respectively formed with a filling layer 6, whereby the filling layer 6 provides the first adhesive layer 31 with a planarization height h2 in each of the separation areas 22 and the planarization height h2 is substantially equal to the line height h1 of the conductive signal lines 21.

The filling layer 6 is formed by filling a liquid state of one of a low dielectric constant material, a low dissipation loss material, a Teflon material in the separation areas 22 through printing, coating, roll-coating, followed by curing through heating or irradiation of ultraviolet light or Infrared light to get shaped and thus form the filling layer 6.

Figure 5:
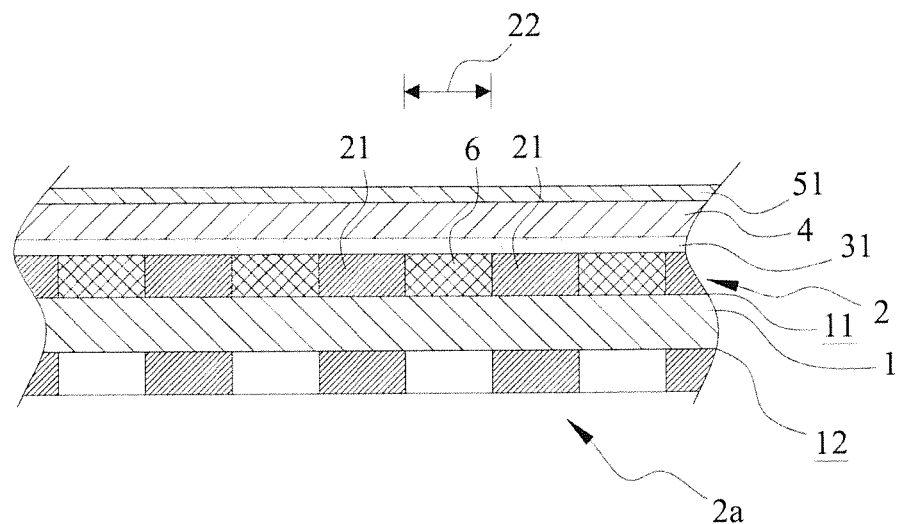
FIG. 5 is a cross-sectional view showing a second surface of the substrate shown in FIG. 4 comprising a bottom conductor layer that corresponds to and is opposite to a conductor layer.

In the arrangement shown in FIG. 4, the substrate 1 is described with reference to an example of a single-sided board. The present invention is also applicable to a double-sided board or a multilayer board. For example, as shown in FIG. 5, it is illustrated that the second surface 12 of the substrate 1 is provided with a bottom conductor layer 2a that corresponds to and is opposite to the conductor layer 2. In this way, the upper surface and the lower surface of a single substrate can be each provided with a conductor layer, thereby providing a structure of a double-sided board.

Figure 6:
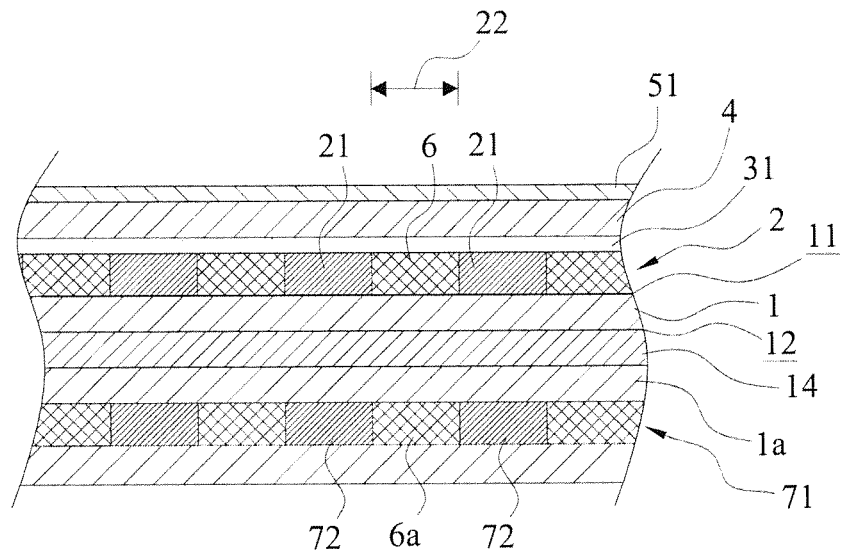
FIG. 6 is a schematic view showing an arrangement of a multilayer board for the substrate shown in FIG. 4.

As shown in FIG. 6, a schematic view showing the substrate 1 can alternatively be of an arrangement of a multilayer board that is formed by stacking at least two single-sided boards is illustrated. In this arrangement, a grounding layer 14 is formed between the substrate 1 and a stacked substrate 1a and the stacked substrate 1a has a bottom surface that is formed of a conductor layer 71. The conductor layer 71 comprises a plurality of conductive signal lines 72 and a filling layer 6a.

Figure 7:
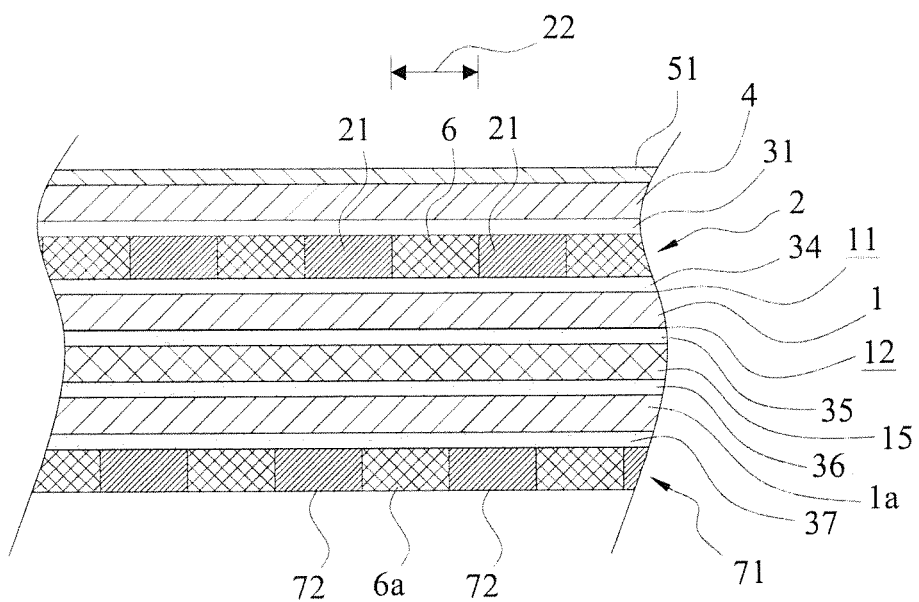
FIG. 7 is a schematic view showing another arrangement of a multilayer board for the substrate shown in FIG. 4.

As shown in FIG. 7, a schematic view showing the substrate 1 can alternatively be of an arrangement of a multilayer board that is formed by stacking at least two single-sided boards in a back-to-back fashion is illustrated. In this arrangement, the second surface 12 of the substrate 1 is further provided with and bonded to a grounding layer 15, a stacked substrate 1a, and a conductor layer 71. The conductor layer 71 comprises a plurality of conductive signal lines 72 and a filling layer 6a. In the instant embodiment, the conductor layer 2, the substrate 1, the grounding layer 15, the stacked substrate 1a, and the conductor layer 71 are respectively bonded with intermediate adhesive layer 34, 35, 36, 37 applied therebetween.

Figure 8:
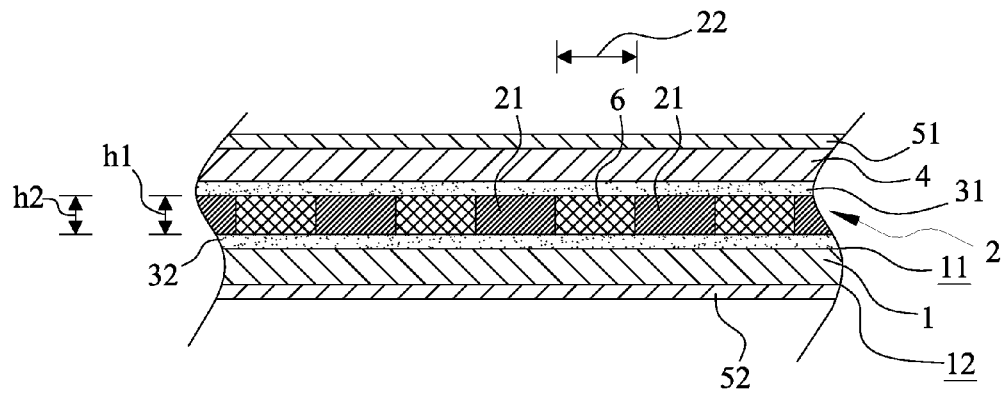
FIG. 8 is a cross-sectional view showing a second embodiment of the present invention.

As shown in FIG. 8, a cross-sectional view of a second embodiment of the present invention is shown. The instant embodiment comprises constituent components that are similar to the counterpart components of the embodiment shown in FIG. 4 and a difference is that each of the conductive signal lines 21 of the conductor layer 2 is bonded by a second adhesive layer 32 to the first surface 11 of the substrate 1.

Further, the second surface 12 of the substrate 1 is bonded to a second metal layer 52. The second metal layer 52 is made of a material of one of a sliver-based material layer, an aluminum-based material layer, a copper-based material layer, a conductive carbon paste, a conductive particle included resin layer.

Figure 9:
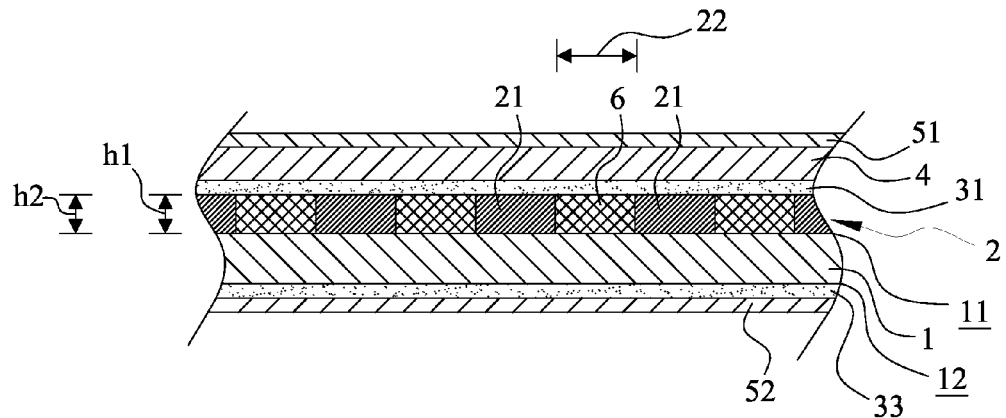
FIG. 9 is a cross-sectional view showing a third embodiment of the present invention.

As shown in FIG. 9, a cross-sectional view of a third embodiment of the present invention is shown. The instant embodiment comprises constituent components that are similar to the counterpart components of the embodiment shown in FIG. 8 and a difference is that the second surface 12 of the substrate 1 is bonded by a third adhesive layer 33 to the second metal layer 52.

Figure 10:
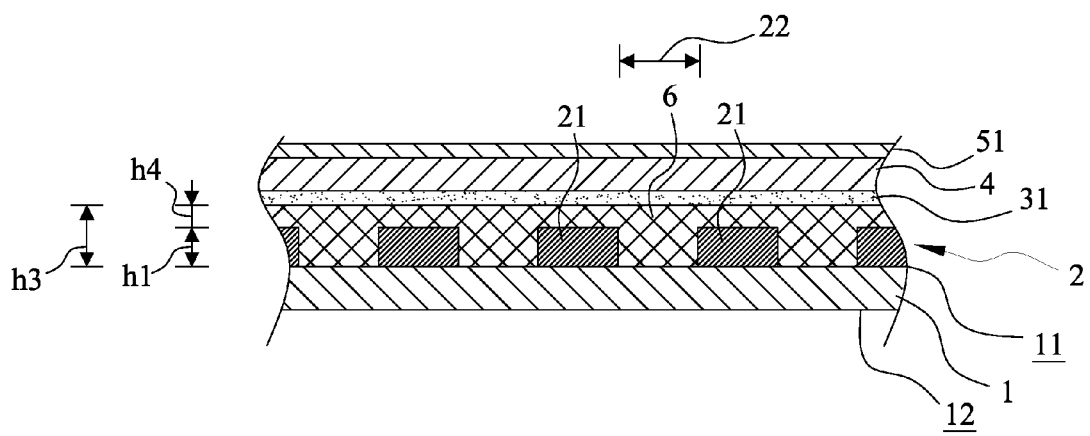
FIG. 10 is a cross-sectional view showing a fourth embodiment of the present invention.

As shown in FIG. 10, a cross-sectional view of a fourth embodiment of the present invention is shown. The instant embodiment comprises constituent components that are similar to the counterpart components of the embodiment shown in FIG. 4 and a difference is that a filling layer 6 having a thickness greater than the filling layer 6 of the embodiment shown in FIG. 4 is used.

In other words, the separation areas 22 between the conductive signal lines 21 of the conductor layer 2 and a surface of each of the conductive signal lines 21 are covered with the filling layer 6 and the filling layer 6 has a filling layer height h3 that is higher than the surfaces of the conductive signal lines 21 of the conductor layer 2 by a covering height h4, whereby the first adhesive layer 31 has a planarization height in the separation areas 22 and the planarization height is substantially equal to the sum of the line height h1 of the conductive signal lines 21 of the conductor layer 2 and the covering height h4.

Figure 11:
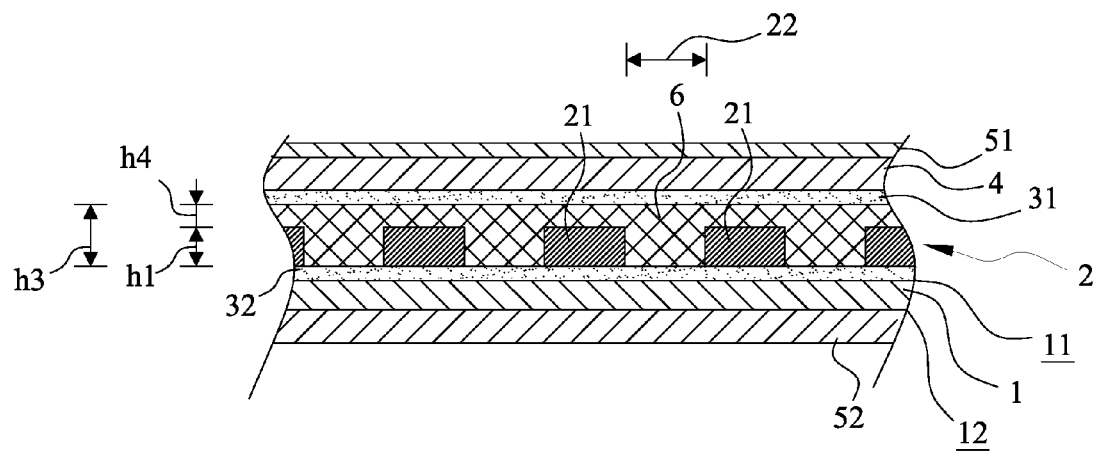
FIG. 11 is a cross-sectional view showing a fifth embodiment of the present invention and FIG. 12 is a cross-sectional view showing a sixth embodiment of the present invention.

As shown in FIG. 11, a cross-sectional view of a fifth embodiment of the present invention is shown. The instant embodiment comprises constituent components that are similar to the counterpart components of the embodiment shown in FIG. 10 and a difference is that each of the conductive signal lines 21 of the conductor layer 2 is bonded by a second adhesive layer 32 to the first surface 11 of the substrate 1. Further, the second surface 12 of the substrate 1 is bonded to a second metal layer 52.

Figure 12:
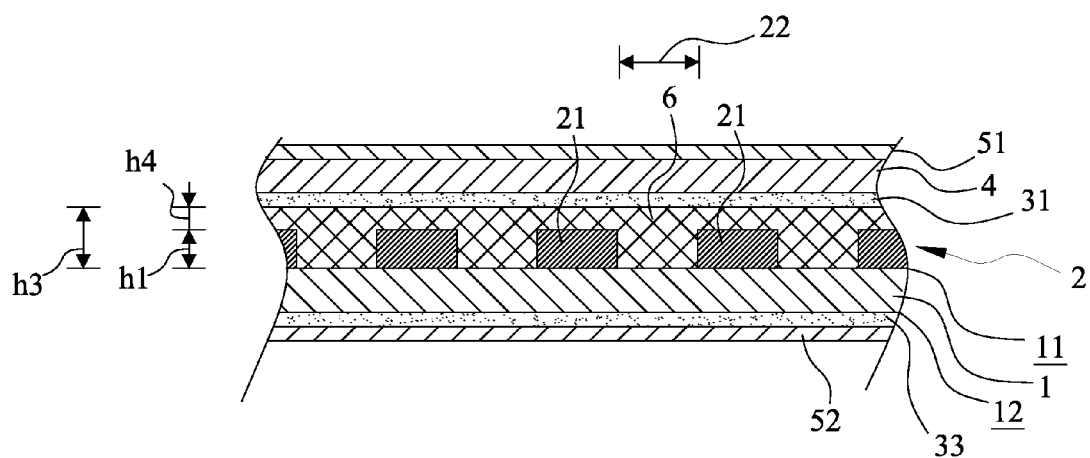

As shown in FIG. 12, a cross-sectional view of a sixth embodiment of the present invention is shown. The instant embodiment comprises constituent components that are similar to the counterpart components of the embodiment shown in FIG. 9 and a difference is that the second surface 12 of the substrate 1 is bonded by a third adhesive layer 33 to the second metal layer 52.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board with a planarized cover layer structure, comprising:
   a substrate, which comprises a first surface and a second surface;
   a conductor layer, which is bonded to the first surface of the substrate, the conductor layer comprising a plurality of extended conductive signal lines, the conductive signal lines being spaced from each other by a predetermined distance so as to define a separation area between adjacent ones of the conductive signal lines;
   a first adhesive layer, which is formed on a surface of the conductor layer;
   an insulation cover layer, which is laminated through the first adhesive layer on the surface of the conductor layer; and
   a first metal layer disposed on the insulation cover layer;
   wherein the separation areas between the conductive signal lines of the conductor layer are respectively formed with a filling layer, whereby the filling layer provides the first adhesive layer with a planarization height in the separation areas and the planarization height is substantially equal to height of the conductive signal lines.

2. The flexible circuit board as claimed in claim 1, wherein the conductive signal lines have a cross-section that is of a shape of one of a rectangle, a trapezoid, a circle, and an ellipse.

3. The flexible circuit board as claimed in claim 1, wherein each of the conductive signal lines transmits a signal that is a differential-mode signal.

4. The flexible circuit board as claimed in claim 1, wherein the filling layer is formed by filling a liquid state of one of a low dielectric constant material, a low dissipation loss material, a Teflon material in the separation areas, followed by curing through heating or irradiation of ultraviolet light or Infrared light to get fixed and shaped and thus forming the filling layer.

5. The flexible circuit board as claimed in claim 1, wherein a second adhesive layer is arranged between the first surface of the substrate and the conductor layer to bond the conductor layer to the first surface of the substrate.

6. The flexible circuit board as claimed in claim 1, wherein the second surface of the substrate is bonded to a second metal layer.

7. The flexible circuit board as claimed in claim 6, wherein the second metal layer is bonded by a third adhesive layer the second surface of the substrate.

8. The flexible circuit board as claimed in claim 1, wherein the substrate comprises one of a single-sided board, a double-sided board, and a multilayer board.

9. A flexible circuit board, the flexible circuit board comprising:
   a substrate, which comprises a first surface and a second surface;
   a conductor layer, which is bonded by a first bonding layer to the first surface of the substrate, the conductor layer comprising a plurality of extended conductive signal lines, the conductive signal lines being spaced from each other by a predetermined distance so as to define a separation area between adjacent ones of the conductive signal lines;
   the first adhesive layer being formed on a surface of the conductor layer;
   an insulation cover layer, which is laminated through the first adhesive layer on the surface of the conductor layer; and
   a first metal layer disposed on the insulation cover layer;
   wherein the separation areas between the conductive signal lines of the conductor layer and a surface of each of the conductor layers are respectively formed with a filling layer, and the filling layer has a height that is higher than the surface of the conductor layer by a covering height, whereby the first adhesive layer has a planarization height in the separation areas and the planarization height is substantially equal to the sum of the height of conductive signal lines and the covering height.

10. The flexible circuit board as claimed in claim 9, wherein the conductive signal lines have a cross-section that is of a shape of one of a rectangle, a trapezoid, a circle, and an ellipse.

11. The flexible circuit board as claimed in claim 9, wherein each of the conductive signal lines transmits a signal that is a differential-mode signal.

12. The flexible circuit board as claimed in claim 9, wherein the filling layer is formed by filling a liquid state of one of a low dielectric constant material, a low dissipation loss material, a Teflon material in the separation areas, followed by curing through heating or irradiation of ultraviolet light or Infrared light to get fixed and shaped and thus forming the filling layer.

13. The flexible circuit board as claimed in claim 9, wherein a second adhesive layer is arranged between the first surface of the substrate and the conductor layer to bond the conductor layer to the first surface of the substrate.

14. The flexible circuit board as claimed in claim 9, wherein the second surface of the substrate is bonded to a second metal layer.

15. The flexible circuit board as claimed in claim 14, wherein the second metal layer is bonded by a third adhesive layer the second surface of the substrate.

16. The flexible circuit board as claimed in claim 9, wherein the substrate comprises one of a single-sided board, a double-sided board, and a multilayer board.

17. A flexible circuit board with a planarized cover layer structure, comprising:
- a substrate, which comprises a first surface and a second surface;
- a conductor layer, which is bonded to the first surface of the substrate, the conductor layer comprising a plurality of extended conductive signal lines, the conductive signal lines being spaced from each other by a predetermined distance so as to define a separation area between adjacent ones of the conductive signal lines;
- a first adhesive layer, which is formed on a surface of the conductor layer;
- an insulation cover layer, which is laminated through the first adhesive layer on the surface of the conductor layer; and
- a second adhesive layer, arranged between the first surface of the substrate and the conductor layer to bond the conductor layer to the first surface of the substrate;
- wherein the separation areas between the conductive signal lines of the conductor layer are respectively formed with a filling layer, whereby the filling layer provides the first adhesive layer with a planarization height in the separation areas and the planarization height is substantially equal to height of the conductive signal lines.

* * * * *